(12) United States Patent
Shigeoka

(10) Patent No.: US 6,534,749 B2
(45) Date of Patent: Mar. 18, 2003

(54) THERMAL PROCESS APPARATUS FOR MEASURING ACCURATE TEMPERATURE BY A RADIATION THERMOMETER

(75) Inventor: Takashi Shigeoka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/968,618

(22) Filed: Oct. 2, 2001

(65) Prior Publication Data

US 2002/0040897 A1 Apr. 11, 2002

(30) Foreign Application Priority Data

Oct. 3, 2000 (JP) .................................... 2000-304098

(51) Int. Cl.[7] ................................................ F27B 5/18
(52) U.S. Cl. ...................... 219/411; 219/390; 219/405; 374/129; 250/492.2; 118/728; 118/729
(58) Field of Search ................................ 219/390, 405, 219/411, 413; 392/416, 418; 118/724, 725, 50.1, 728, 729, 730; 374/129; 250/492.2

(56) References Cited

U.S. PATENT DOCUMENTS 3,973,122 A * 8/1976 Goldberg .................... 250/338
6,333,493 B1 * 12/2001 Sakurai et al. .............. 219/497
6,437,290 B1 * 8/2002 Shao et al. .................. 219/390
6,462,315 B2 * 10/2002 Hauf .......................... 219/502

* cited by examiner

Primary Examiner—Teresa Walberg
Assistant Examiner—Shawntina Fuqua
(74) Attorney, Agent, or Firm—Pillsbury Winthrop LLP

(57) ABSTRACT

A heat treatment apparatus applies an accurate heat treatment to a wafer by performing an accurate measurement of a temperature of a wafer by a radiation thermometer. Halogen lamps heat the wafer by irradiating a light on a front surface of the wafer. A guard ring supports the wafer so that the front surface of the wafer faces the halogen lamps. A gap is formed between the guard ring and a back surface of the wafer. The radiation thermometer detects a light radiated from the backside of the wafer by a quartz rod facing the backside of the substrate. The wafer placed on the guard ring defines a first space on the front surface side of the wafer and a second space on the back surface side of the wafer. The gap is configured and arranged so that an incident rate of a stray light entering the second space from the first space through the gap and incident on the quartz rod is equal to or less than a predetermined value, where the incident rate is defined by a ratio of an amount of the stray light incident on the quartz rod to an amount of light radiated by the halogen lamps.

6 Claims, 7 Drawing Sheets

THERMAL PROCESS APPARATUS FOR MEASURING ACCURATE TEMPERATURE BY A RADIATION THERMOMETER

BACKGROUND OF THE INVENTION

1. Field of the Invention

The present invention generally relates to heat treatment apparatus and, more particularly, to a heat treatment apparatus applying a heat treatment to a semiconductor substrate and a method for designing such a heat treatment apparatus and a computer readable recording medium storing such a design method.

2. Description of the Related Art

In heat treatment apparatuses, such as a chemical vapor deposition (CVD) apparatus, an annealing apparatus, etc. for forming a semiconductor integrated circuit on a wafer, a wafer is heated by irradiating a light from a heat source. In order to always make temperature of the heated wafer uniform, the wafer is rotated in a predetermined plane facing the heat source during heating.

FIGS. 1A and 1B are views showing a composition of a conventional guard ring 10 used for holding a wafer in a heat treatment apparatus. As shown in FIG. 1A, the guard ring 10 has a doughnut-like form, which has a peripheral part 32 and a hollow part 31. Between the hollow part 31 and the peripheral part 32, an annular stage 33 is formed which is one step lower than the perimeter part 32. The guard ring 10 is generally formed of silicon carbide (SiC).

As shown in FIG. 1B, in the guard ring 10, which has the above-mentioned composition, a wafer 30 (not shown in FIG. 1A) is placed on the stage 33. The wafer 30 is heated by a light (heat ray) irradiated from the heat source (not shown) located above the wafer 30 in FIG. 1B at a temperature for applying a desired heat treatment.

Since the wafer 30 to be heat-treated is brought into surface-contact with the stage 33 of the guard ring 10, which has a comparatively large heat capacity, a temperature increasing rate of the peripheral edge of the wafer 30 is smaller than other portions of the wafer 30. Thereby, there is a problem in that a processing temperature becomes uneven in the heat treatment of the wafer 30.

In order to avoid such a problem, a guard ring 21 having a structure shown in FIG. 2 has been suggested. That is, as shown in FIG. 2, although the guard ring 21 has the same composition as the guard ring 10 shown in FIG. 1, convex parts (protrusions) 35 are provided on at least three positions of the stage 33 so that the wafer 30 is supported by the convex parts 35.

Therefore, since the wafer 30 contacts the guard ring 21 only at the convex parts 35, the above-mentioned influence, which is given to the wafer 30 by a large heat capacity of the guard ring 21, can be avoided.

However when the wafer 30 is separated from the stage 33 of the guard ring 21 as shown in FIG. 2, a radiation light 36 irradiated to heat the wafer 30 may enter the hollow part 31 of the guard ring 21 through a gap 34. Accordingly, in a heat treatment apparatus which measures a temperature of the heated wafer 30 by detecting a light radiated from the wafer 30 using a quartz rod 29 which is provided under the wafer 30 as shown in FIG. 2, a so-called stray light, which enters the hollow part 31 through the gap 34 as mentioned above may act as a noise in the detection of light by the quartz rod 29, which results in a problem in that the temperature of the wafer 30 cannot be measured with high accuracy.

SUMMARY OF THE INVENTION

It is a general object of the present invention to provide an improved and useful heat treatment apparatus in which the above-mentioned problems are eliminated.

A more specific object of the present invention is to provide a heat treatment apparatus which can apply an accurate heat treatment to a wafer by performing an accurate measurement of a temperature of the wafer by a radiation thermometer.

Another object of the present invention is to provide a method of designing a heat treatment apparatus which can apply an accurate heat treatment to a wafer by performing an accurate measurement of a temperature of the wafer by a radiation thermometer.

In order to achieve the above-mentioned objects, there is provided according to one aspect of the present invention a heat treatment apparatus comprising: a heat source heating a substrate by irradiating a light on a first surface of the substrate; a support member supporting the substrate so that the first surface of the substrate faces the heat source and a predetermined gap is formed between a surface of the support member and a second surface of the substrate opposite to the first surface; and a temperature measuring device measuring a temperature of the substrate by detecting a light radiated from the second surface of the substrate by at least one light-detecting part facing the second surface of the substrate, wherein the substrate placed on the support member defines a first space on a side of the first surface of the substrate and a second space on a side of the second surface of the substrate, and the predetermined gap is configured and arranged so that an incident rate of a stray light entering the second space from the first space through the predetermined gap and incident on the light-detecting part is equal to or less than a predetermined value, where the incident rate is defined by a ratio of an amount of the stray light incident on the light-detecting part to an amount of light radiated by the heat source.

According to the above-mentioned invention, a light entering the second space through the predetermined gap between the substrate and the support member is prevented from being detected by the temperature measuring means as a noise. Thereby, the accuracy of the temperature measurement by the temperature measuring device can be improved, and the accuracy of the heat treatment applied to the substrate can be improved.

In the heat treatment apparatus according to the present invention, the support member may have a flat, annular shape with a plurality of protrusions formed on the surface thereof so that the substrate is placed on the protrusions and a width of the predetermined gap is defined by a height of the protrusions and a length of the predetermined gap is defined by an overlapping distance along which an outer peripheral part of the substrate overlaps with the support member, and a ratio of the overlapping distance of the substrate to the height of the protrusions may be determined based on the predetermined value of the incident rate.

Additionally, the heat source may comprise a plurality of halogen lamps, and the temperature measuring device may be a radiation thermometer having at least one quartz rod serving as the light-receiving part.

Additionally, there is provided according to another aspect of the present invention a method of designing a heat treatment apparatus comprising: a heat source heating a substrate by irradiating a light on a first surface of the substrate; a support member supporting the substrate so that the first surface of the substrate faces the heat source and a gap is formed between a surface of the support member and a second surface of the substrate opposite to the first surface; and a temperature measuring device measuring a temperature of the substrate by detecting a light radiated from the second surface of the substrate by at least one light-detecting part facing the second surface of the substrate, the method comprising the steps of: selecting a plurality of design values of the support member; calculating incidence rates of a stray light incident on the light-detecting part for a plurality of cases in which a plurality of the gaps defined by the selected design values are used, the stray light being radiated from the heat source and reaches the light-detecting part by traveling through the gap between the substrate and the support member; defining an approximation curve which approximates the calculated incidence rates for the design values of the support member; determining the design value of the support member which satisfies a maximum value of the incidence rate allowable for the heat treatment apparatus in accordance with the approximation curve; and designing the support member using the determined design value.

According to the above-mentioned invention, the support member of the heat treatment apparatus can be easily designed so that a light entering through the gap formed between the substrate and the support member is prevented from being incident on the light-detecting part of the temperature measuring device as a noise. Accordingly, an accurate heat treatment apparatus can be provided at a low cost.

In the above-mentioned method of designing a heat treatment apparatus, the support member may have a flat, annular shape with a plurality of protrusions formed on the surface thereof so that the substrate is placed on the protrusions and a width of the gap is defined by a height of the protrusions and a length of the gap is defined by an overlapping distance along which an outer peripheral part of the substrate overlaps with the support member, and the design value of the support member may be a ratio of the overlapping distance to the height of the protrusions.

Additionally, there is provided according to another aspect of the present invention a processor readable medium storing program code for causing a computer to design a support member of a heat treatment apparatus comprising: a heat source heating a substrate by irradiating a light on a first surface of the substrate; the support member supporting the substrate so that the first surface of the substrate faces the heat source and a gap is formed between a surface of the support member and a second surface of the substrate opposite to the first surface; and a temperature measuring device measuring a temperature of the substrate by detecting a light radiated from the second surface of the substrate by at least one light-detecting part facing the second surface of the substrate, the program code comprising: program code means for selecting a plurality of design values of the support member; program code means for calculating incidence rates of a stray light incident on the light-detecting part for a plurality of cases in which a plurality of the gaps defined by the selected design values are used, the stray light being radiated from the heat source and reaches the light-detecting part by traveling through the gap between the substrate and the support member; program code means for defining an approximation curve which approximates the calculated incidence rates for the design values of the support member; program code means for determining the design value of the support member which satisfies a maximum value of the incidence rate allowable for the heat treatment apparatus in accordance with the approximation curve; and program code means for designing the support member using the determined design value.

According to the processor readable medium of the present invention, since the above-mentioned design is realizable with software, a heat treatment apparatus can be designed still more easily.

Other objects, features and advantages of the present invention will become more apparent from the following detailed descriptions when read in conjunction with the accompanying drawings.

DETAILED DESCRIPTION OF THE PREFERRED EMBODIMENT

Figure 1A:
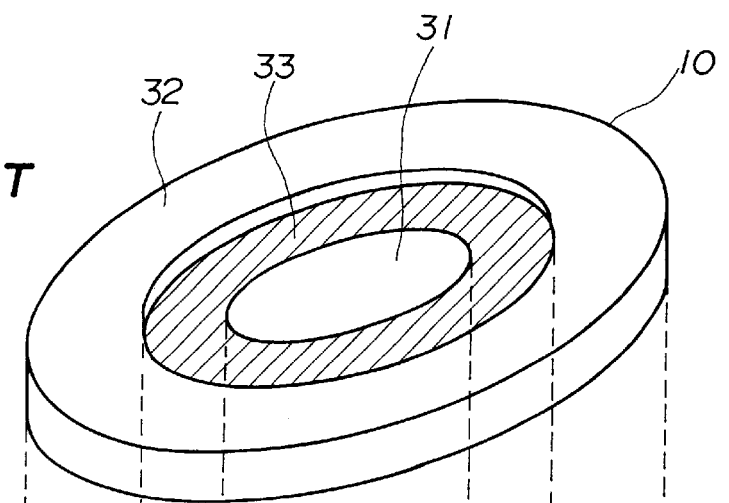
FIG. 1A is a perspective view of an example of a conventional guard ring.
Figure 1B:
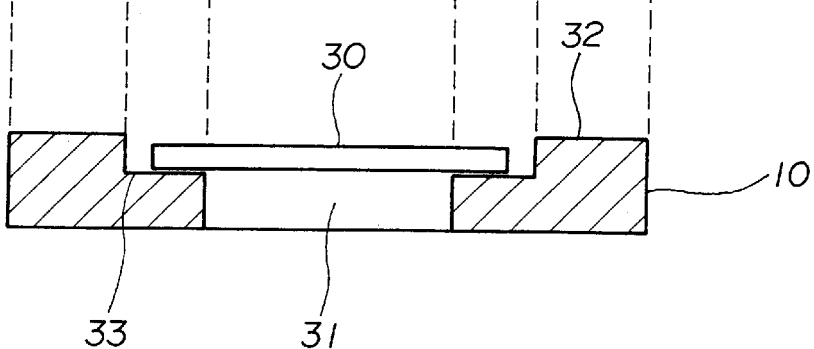
FIG. 1B is a cross-sectional view of the guard ring shown in FIG. 1A.
Figure 2:
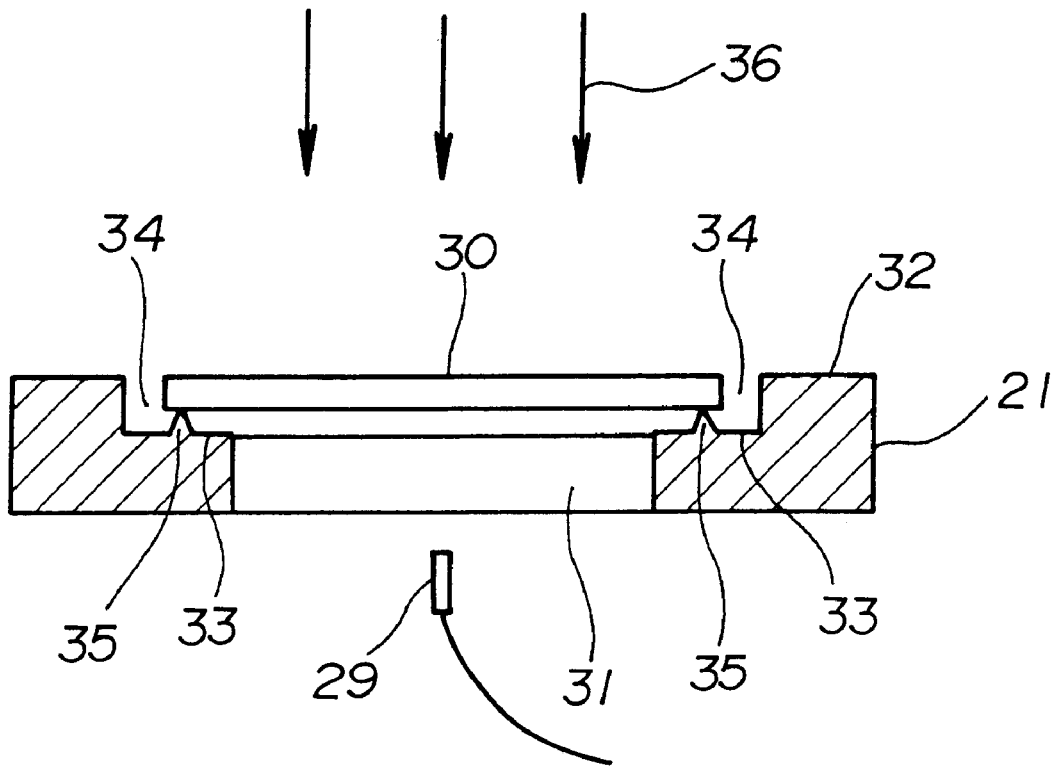
FIG. 2 is a cross-sectional view of another example of a conventional guard ring.

A description will now be given below, with reference to the drawings, of a heat treatment apparatus according to an embodiment of the present invention. In the figures, the same parts or equivalent parts are given the same reference numerals.

Figure 3:
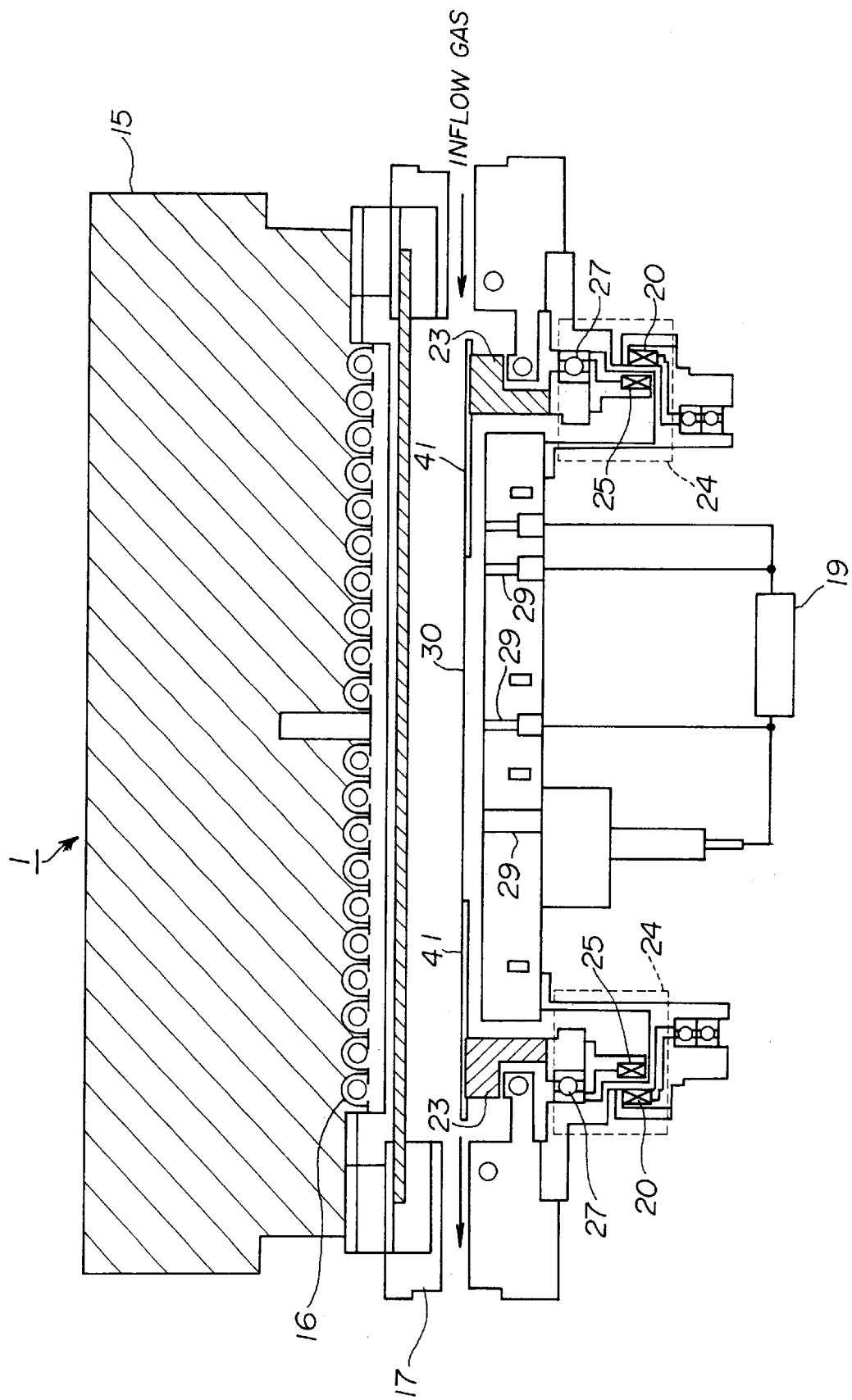
FIG. 3 is a cross-sectional view of a rapid thermal process apparatus according to an embodiment of the present invention.

FIG. 3 is a cross-sectional view of a rapid thermal process apparatus (RTP apparatus) according to an embodiment of the present invention. As shown in FIG. 3, the rapid thermal process apparatus according to the present embodiment comprises: a plurality of halogen lamps 16; a halogen lamp house 15 which adjusts an electric power supplied to the halogen lamps 16; a chamber 17 which accommodates a wafer (substrate) 30 to be processed; and a radiation thermometer 19. Instead of the halogen lamps 16 as a means for heating the wafer 30, a resistance heat source may be provided, which uses a resistor radiating heat by being supplied with an electric current.

The chamber 17 is provided with a guard ring (support member) 41, a quartz support ring 23 which supports the guard ring 41 and a rotation part 24 for rotating the guard ring 41 on which the wafer 30 is attached. The rotation part 24 includes a magnetic body 25, a bearing 27 and a magnet 20 arranged outside the chamber 17. Moreover, the chamber 17 is provided with a plurality of quartz rods 29, which detect a light radiated from the wafer 30. Each of the quartz rods 29 is connected to a radiation thermometer (temperature measuring device) 19 by an optical fiber. A vacuum can be formed inside the chamber 17.

In the rapid thermal process apparatus 1 having the above-mentioned composition, while the wafer 30 is heated by the halogen lamps 16, the guard ring 41 on which the wafer 30 is placed, is rotated by the rotation part 24. Thereby, the radiation light from the halogen lamps 16 is irradiated on the whole surface of the wafer 30 without uneven distribution. For this reason, the uniformity of a temperature distribution of the wafer 30 under heating is higher than that of a case where the wafer 30 is not rotated.

The rotation part 24 includes a magnetic member 25 provided to the quartz support ring 23 and a magnet 20 rotatable around the magnetic member so as to form a magnetic coupling between the magnet 20 and the magnetic material 25 magnetized by the magnet 20 so that the quartz support ring 23 can be rotated on the bearing 27. Thereby, the guard ring 41, which is supported on the quartz support ring 23, is rotated in a predetermined plane facing the halogen lamps 16 while and the wafer 30 is attached thereto.

Figure 4:
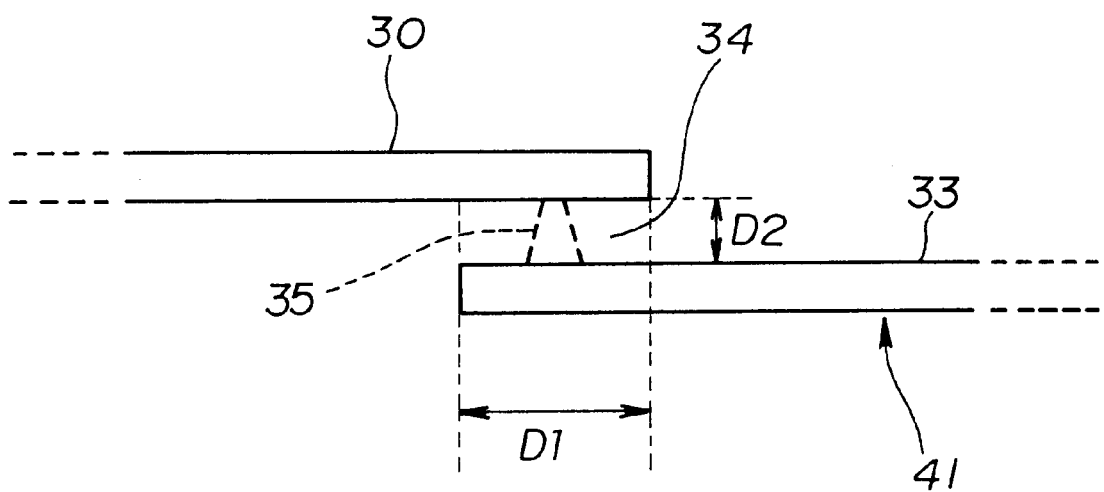
FIG. 4 is an enlarged view of a part of a guard ring shown in FIG. 3.

FIG. 4 is an enlarged cross-sectional view of the guard ring 41 shown in FIG. 3. As shown in FIG. 4, convex parts (protrusions) 35 are provided in at least three positions of the stage 33 of the guard ring 41, and the wafer 30 to which a heat treatment is applied is supported by the convex parts 35. In FIG. 4, D1 indicates an overlapping length along which the wafer 30 overlaps with the guard ring 41, and D2 indicates a width of a gap between a backside of the wafer 30 and the stage 33 of the guard ring 41. It should be noted that the gap is formed since the wafer 30 is placed on the convex parts (protrusions) 35 of the guard ring 41, and the width of the gap corresponds to the height of the convex parts 35.

Figure 5:
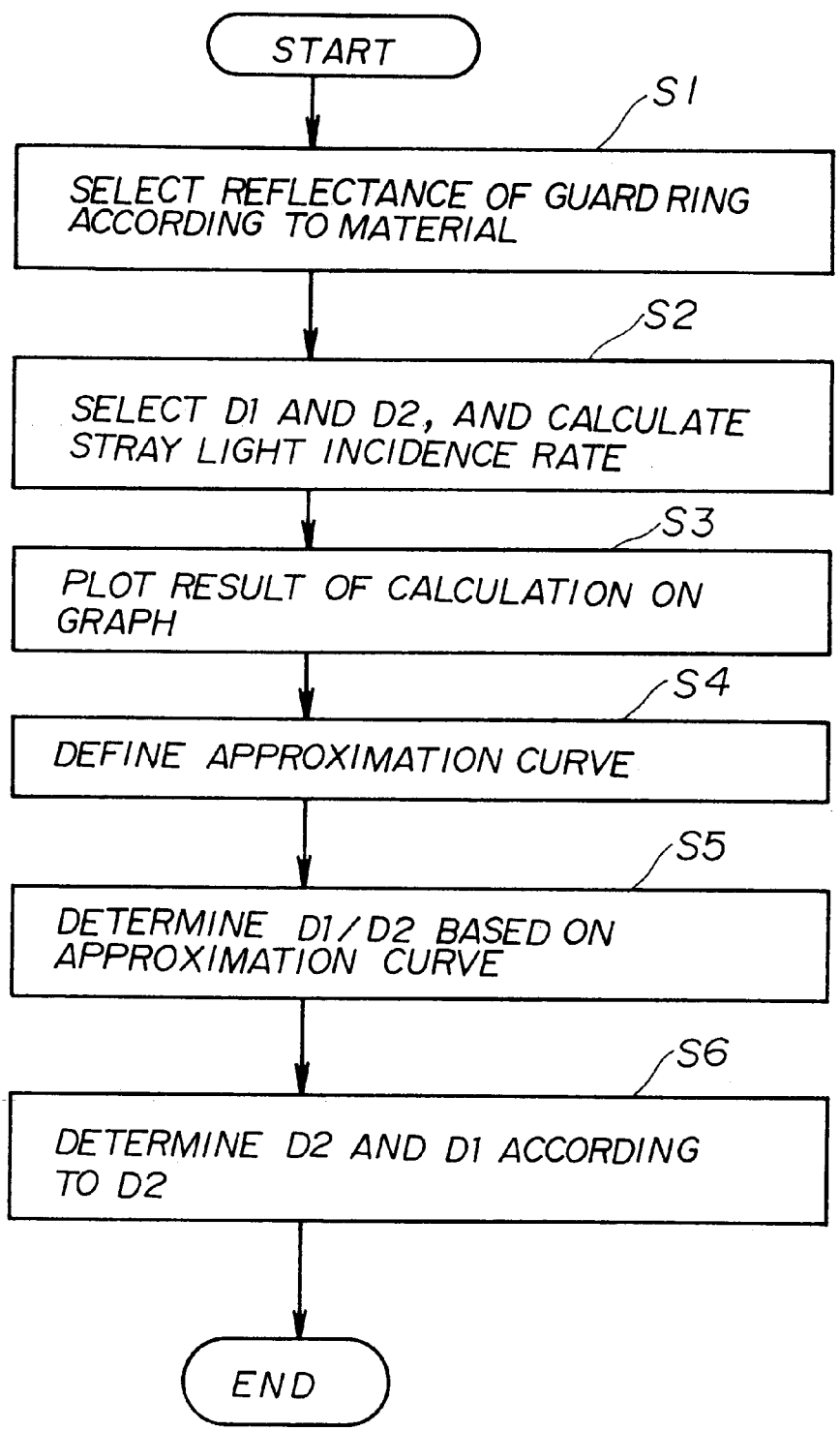
FIG. 5 is a flowchart of a method for designing the guard ring shown in FIG. 3.

A description will now be given, with reference to a flowchart shown in FIG. 5, of a method of determining the length D1 and the interval D2. It should be noted that, in the following explanation, a radiance of the halogen lamp 16 equivalent to a color temperature of 3000° C. is set to 14216858.49 (W/(m$^2$·Sr)).

First, in step S1, the reflectance of the guard ring 41 is selected according to the material of the guard ring 41. Here, for instance, a case where a reflectance is 0.2 and a case where a reflectance is 0.4 are selected.

Next, in step S2, by arbitrarily selecting the overlapping length D1 and the width D2 are arbitrarily selected, and a stray light incidence rate (5) of a stray light incident on the quartz rods 29 is calculated in a case in which the guard ring 41, which has the selected length D1 and interval D2, is incorporated into the rapid thermal process apparatus 1. In addition, a plurality of sets of values of the overlapping length D1 and the width D2 are selected so that those ratios D1/D2 differ from each other, and the stray light incidence rate (%) according to each of the sets is computed.

The "stray light incidence rate" is defined as a ratio of an amount of light detected by the quartz rods 29 arranged under the wafer 30 to an amount of light radiated by the halogen lamps 16. The stray light incidence rate is obtained by calculating a rate of attenuation in a case in which a stray light travels within the gap 34, which is formed between the wafers 30 and the guard rings 41 shown in FIG. 4, while being reflected by the wafer 30 and the guard ring 41. It should be noted that, in the above-mentioned calculation, a rate of radiance of the wafer 30 is assumed to be zero as an example.

Figure 6:
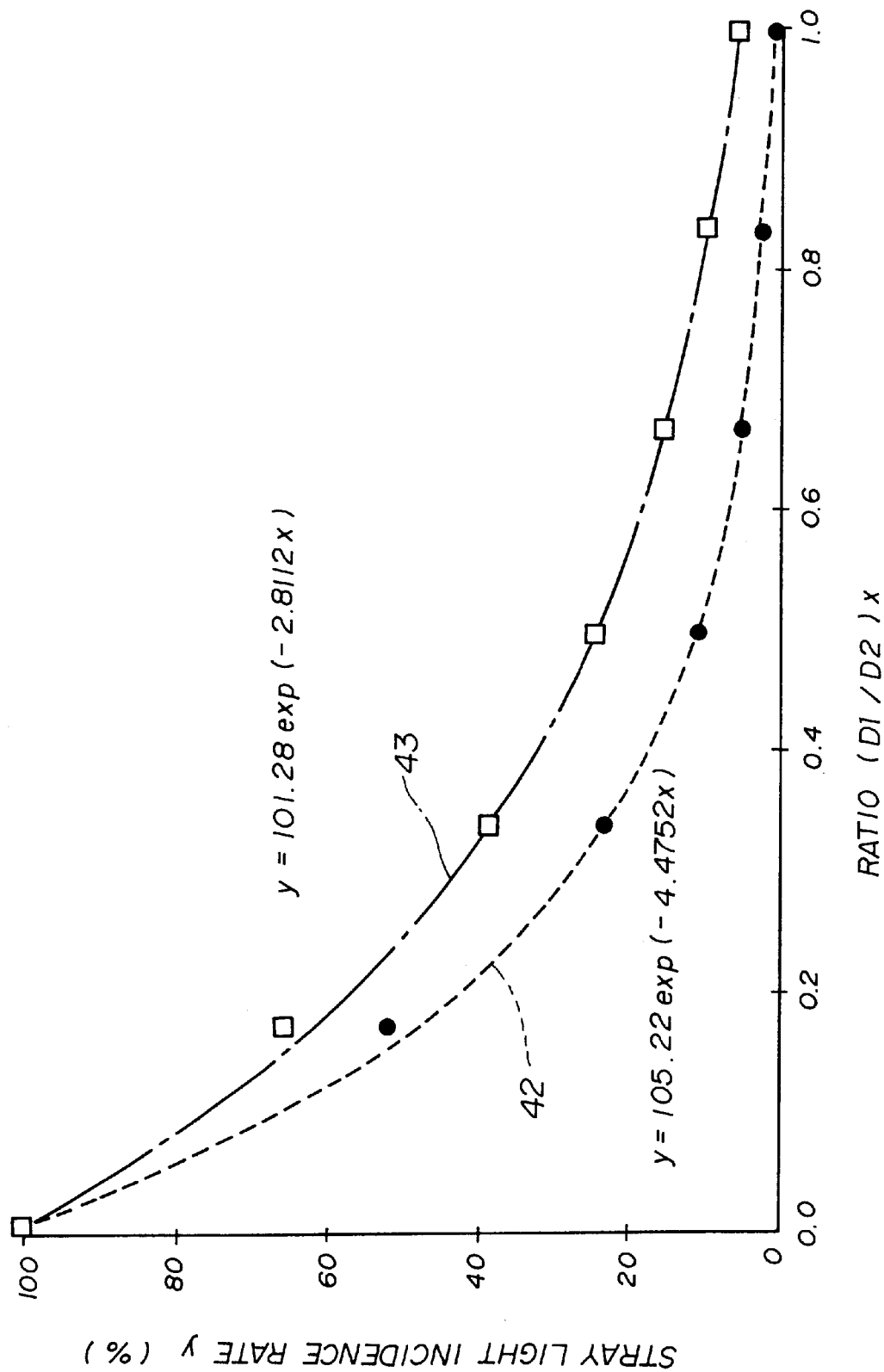
FIG. 6 is a graph showing a relationship between a stray light incidence rate and a design value of the guard ring.

Next, in step S3, the result of calculation of step S2 is plotted on a graph having a vertical axis representing the stray light incidence rate (%) and a horizontal axis representing the ratio D1/D2, as shown in FIG. 6. It should be noted that, in FIG. 6, the result of calculation in a case in which the reflectance of the guard ring 41 is set to 0.2 is indicated by solid circles, and the result of calculation in a case in which the reflectance of the guard ring 41 is set to 0.4 is indicated by blank squares.

Next, in step S4, approximation curves of the respective cases in which the reflectance is 0.2 and 0.4. More specifically, the approximation curves can be obtained by carrying out fitting using an exponential function.

Accordingly, as shown in FIG. 6, the approximation curve 42 represented by the following formula (1) is obtained with respect to the case in which the reflectance is 0.2.

$$y=105.28 \exp(-4.4752x) \tag{1}$$

Similarly, the approximation curve 43 represented by the following formula (2) is obtained with respect to the case in which the reflectance is 0.4.

$$y=101.28 \exp(1\ 2.8112x) \tag{2}$$

Next, in step S5, the ratio D1/D2 corresponding to a maximum stray light incidence rate allowable for the rapid thermal process apparatus 1 is computed based on the above-mentioned approximation curves.

A specific example is explained below.

In the rapid thermal process apparatus 1, it is assumed that the incidence of stray light on the quartz rods 29 is permitted to the quantity corresponding to a maximum radiance of 0.00004 (W/(m$^2$·Sr)). At this time, the stray light incidence rate (%) is represented by (0.00004/14216858.49)×100. If this value is substituted for the left side of the above-mentioned formula (2), the ratio D1/D2 at this time is computed as 9.46.

Then, in step S6, the width D2 and the overlapping length D1 according to the width D2 are computed based on the ratio D1/D2 obtained in step S5. Specifically, in the above-mentioned example, if the interval D2 is calculated as 4.8 mm, the length D1 is calculated from the value 9.46 of the above-mentioned ratio D1/D2.

In the above-mentioned example, the overlapping length D1 along which the guard ring 41 overlaps with the wafer 30 in a radial direction must be equal to or greater than 4.8 mm when the wafer 30 to be subjected to a heat treatment is lifted from the stage 33 of the guard ring 41 by 0.5 mm. In other words, if the overlapping length D1 is 4.8 mm at minimum, a stray light from the halogen lamps 16 can be cut into an allowable limit even if the halogen lamps 16 with a color temperature of 3000° C. is used.

It should be noted that, in the above-mentioned example, when the overlapping length D1 is 4 mm, a value of 0.0024 (W/(m$^2$·Sr)) is computed as a radiance of the stray light incident on the quartz rods 29 by using the above-mentioned formula (2). Therefore, in this case, even when the color temperature of the halogen lamp 16 is 3000° C., the measurement error in the radiation thermometer 19 whose measurement minimum is 300° C. is suppressed by about 10° C.

Moreover, a description will be given, as another example, of a case in which a color temperature of the halogen lamps 16 used for heating the wafer 30 is 2500° C.

In this case, since the radiance of the halogen lamps 16 is set to 4357645.298 (W/(m$^2$·Sr)), the maximum stray light incidence rate (%) permitted is obtained by (0.00004/4357645.298)×100. By substituting this value for the left side of the above-mentioned formula (2), the ratio D1/D2 at this time is computed as 9.04.

Therefore, if the width D2 is set to 4.1 mm similar to the aforementioned example, the overlapping length D1 is calculated as 4.1 mm. Accordingly, in the above example, the overlapping length D1 along which the guard ring 41 overlaps with the wafer 30 in a radial direction must be equal to or greater than 4.1 mm. In other words, when the halogen lamps 16 with a color temperature of 2500° C. are used, a stray light from the halogen lamps 16 can be cut into an allowable limit if the overlapping length D1 is 41 mm at minimum.

Figure 7:
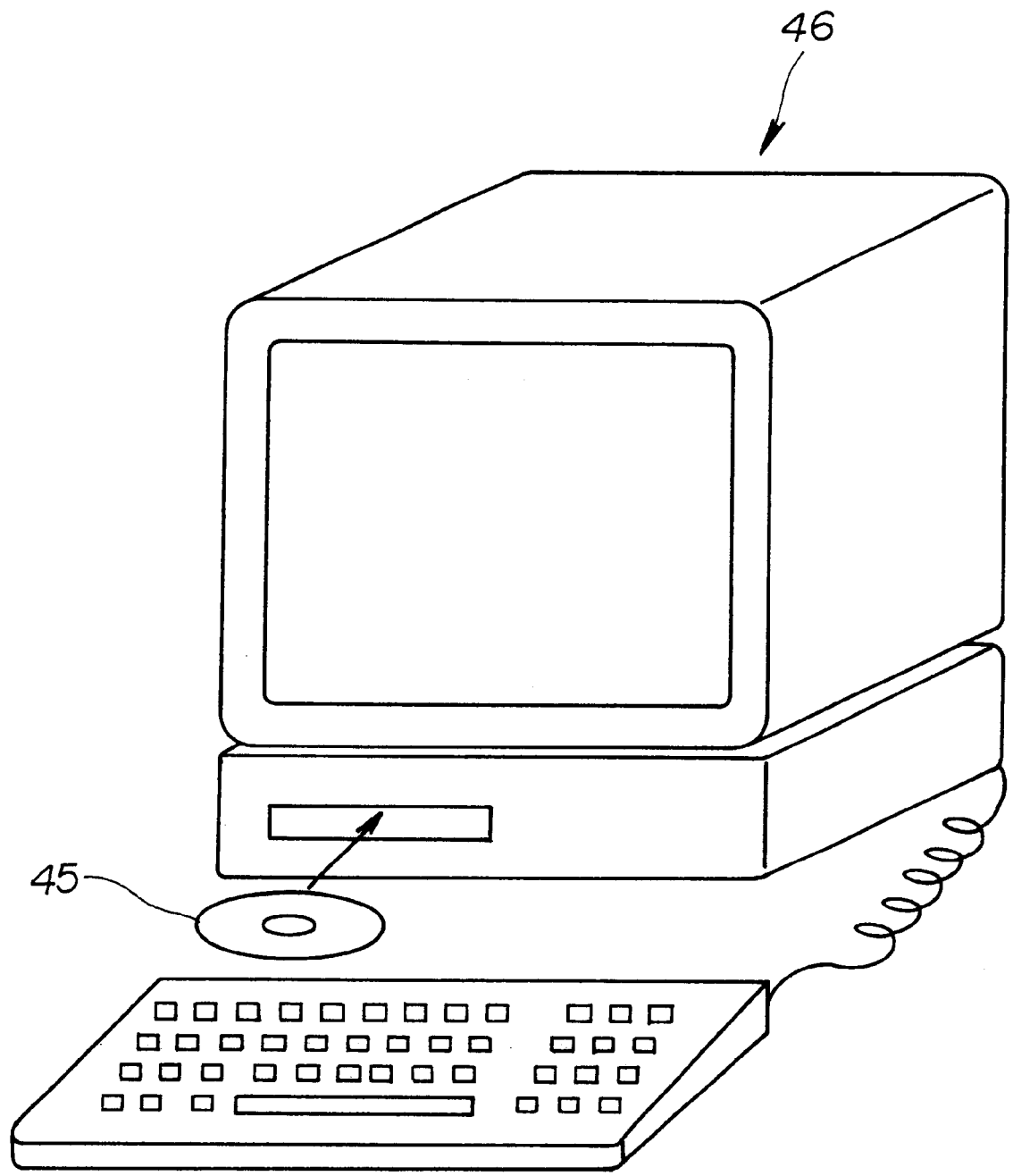
FIG. 7 is an illustration showing a recording medium storing a program for carrying out the method for designing the guard ring.

It should be noted that the above-mentioned design method of the rapid thermal process apparatus 1 is easily realizable with software. That is, the design method shown in FIG. 5 is described by a program, and the program is recorded on a computer readable recording medium such as a CD-ROM 45 as shown in FIG. 7.

Then, the design values with respect to the overlapping length D1 and the width D2 can be obtained by loading the CD-ROM 45 to a computer 46 and causing the computer 46 to perform the program recorded on the CD-ROM 45.

As mentioned above, the rapid thermal process apparatus 1 according to the present embodiment of is provided with the guard ring 41, which is designed so that a position relationship with the wafer 30 becomes optimum. Therefore, it can be avoided that the radiation light irradiated for heating the wafer 30 is incident on the quartz rods 29 as a noise.

For this reason, the accuracy of temperature measurement of the wafer 30 by radiation thermometer 19 can be improved. Thus, the accuracy of the temperature control in the rapid thermal process apparatus 1 can be improved, which results in a heat treatment being applied to the wafer 30 with high accuracy.

The present invention is not limited to the specifically disclosed embodiments, and variations and modifications may be made without departing from the scope of the present invention.

The present application is based on Japanese priority application No. 2000-304098 filed on Oct. 3, 2000, the entire contents of which are herein incorporated by reference.

What is claimed is:

1. A heat treatment apparatus comprising:

a heat source heating a substrate by irradiating a light on a first surface of the substrate;

a support member supporting the substrate so that the first surface of the substrate faces said heat source and a predetermined gap is formed between a surface of said support member and a second surface of the substrate opposite to the first surface; and a temperature measuring device measuring a temperature of the substrate by detecting a light radiated from the second surface of the substrate by at least one light-detecting part facing the second surface of the substrate, wherein the substrate placed on said support member defines a first space on a side of the first surface of the substrate and a second space on a side of the second surface of the substrate, and said predetermined gap is configured and arranged so that an incident rate of a stray light entering the second space from the first space through said predetermined gap and incident on said light-detecting part is equal to or less than a predetermined value, where the incident rate is defined by a ratio of an amount of the stray light incident on said light-detecting part to an amount of light radiated by said heat source.

2. The heat treatment apparatus as claimed in claim 1, wherein said support member has a flat, annular shape with a plurality of protrusions formed on the surface thereof so that the substrate is placed on the protrusions and a width of said predetermined gap is defined by a height of the protrusions and a length of said predetermined gap is defined by an overlapping distance along which an outer peripheral part of the substrate overlaps with said support member, and a ratio of the overlapping distance to the height of said protrusions is determined based on said predetermined value of the incident rate.

3. The heat treatment apparatus as claimed in claim 1, wherein said heat source comprises a plurality of halogen lamps, and said temperature measuring device is a radiation thermometer having at least one quartz rod serving as said light-receiving part.

4. A method of designing a heat treatment apparatus comprising:

a heat source heating a substrate by irradiating a light on a first surface of the substrate;

a support member supporting the substrate so that the first surface of the substrate faces said heat source and a gap is formed between a surface of said support member and a second surface of the substrate opposite to the first surface; and a temperature measuring device measuring a temperature of the substrate by detecting a light radiated from the second surface of the substrate by at least one light-detecting part facing the second surface of the substrate, the method comprising the steps of:

selecting a plurality of design values of said support member;

calculating incidence rates of a stray light incident on said light-detecting part for a plurality of cases in which a plurality of said gaps defined by the selected design values are used, the stray light being radiated from said heat source and reaches said light-detecting part by traveling through said gap between the substrate and said support member;

defining an approximation curve which approximates the calculated incidence rates for the design values of said support member;

determining the design value of said support member which satisfies a maximum value of the incidence rate allowable for said heat treatment apparatus in accordance with said approximation curve; and designing said support member using the determined design value.

5. The method of designing a heat treatment apparatus as claimed in claim 4, wherein said support member has a flat, annular shape with a plurality of protrusions formed on the surface thereof so that the substrate is placed on the protrusions and a width of said gap is defined by a height of the protrusions and a length of said gap is defined by an overlapping distance along which an outer peripheral part of the substrate overlaps with said support member, and the design value of said support member is a ratio of the overlapping distance to the height of said protrusions.

6. A processor readable medium storing program code for causing a computer to design a support member of a heat treatment apparatus comprising:

a heat source heating a substrate by irradiating a light on a first surface of the substrate;

said support member supporting the substrate so that the first surface of the substrate faces said heat source and a gap is formed between a surface of said support member and a second surface of the substrate opposite to the first surface; and a temperature measuring device measuring a temperature of the substrate by detecting a light radiated from the second surface of the substrate by at least one light-detecting part facing the second surface of the substrate, the program code comprising:
program code means for selecting a plurality of design values of said support member;
program code means for calculating incidence rates of a stray light incident on said light-detecting part for a plurality of cases in which a plurality of said gaps defined by the selected design values are used, the stray light being radiated from said heat source and reaches said light-detecting part by traveling through said gap between the substrate and said support member;
program code means for defining an approximation curve which approximates the calculated incidence rates for the design values of said support member;
program code means for determining the design value of said support member which satisfies a maximum value of the incidence rate allowable for said heat treatment apparatus in accordance with said approximation curve; and
program code means for designing said support member using the determined design value.

* * * * *